United States Patent [19]
Gomi

[11] Patent Number: 4,994,881
[45] Date of Patent: Feb. 19, 1991

[54] BIPOLAR TRANSISTOR

[75] Inventor: Takayuki Gomi, Tokyo, Japan

[73] Assignee: Sony Corporation, Tokyo, Japan

[21] Appl. No.: 309,235

[22] Filed: Feb. 13, 1989

[30] Foreign Application Priority Data

Feb. 16, 1988 [JP] Japan .................................. 033686

[51] Int. Cl.⁵ ............................................ H01L 29/72
[52] U.S. Cl. ........................................ 357/34; 357/35
[58] Field of Search ...................... 357/34, 15, 20, 49, 357/50, 34, 35; 437/39, 82

[56] References Cited

U.S. PATENT DOCUMENTS 4,706,378 11/1987 Havemann ............................ 437/24
4,755,476 7/1988 Böhm ................................... 437/31

FOREIGN PATENT DOCUMENTS 0096155 12/1983 European Pat. Off. .
0231811 8/1987 European Pat. Off. .
0251927 7/1988 European Pat. Off. .

OTHER PUBLICATIONS

Japanese Patent Abstracts of Japan, vol. 11, No. 190 (E-517) (2637) Jun. 18, 1987, 62-17763.
Japanese Patent Abstract of Japan, vol. 10, No. 117 (E-400) 2174, May 2, 1986.

Primary Examiner—Rolf Hille
Assistant Examiner—Roy K. Potter
Attorney, Agent, or Firm—Hill, Van Santen, Steadman & Simpson

[57] ABSTRACT

An improved bipolar transistor is a vertical type bipolar transistor the base region of which is composed of a graft base region, an intrinsic base region separated from the graft base region and having an emitter region in its inside, and a link impurity diffusion region linking these regions. In the preparation, the graft base region is formed by diffusion of impurities from the base contact electrode layer and the emitter region formed in the intrinsic base region may be formed in self-alignment. In the vicinity of the junction between the base region and the semiconductor substrate, there is formed a diffusion suppression region composed of an impurity diffusion region of a conductivity type opposite to the conductivity type of the base region and adapted for preventing the depth of junction from being increased.

4 Claims, 3 Drawing Sheets

BIPOLAR TRANSISTOR

BACKGROUND OF THE INVENTION

1. Field of the Invention

This invention relates to a bipolar transistor and the method of producing the same. More particularly, it relates to a bipolar transistor and the method of producing the same, wherein a graft base region is formed in the semiconductor substrate by diffusion of impurities from a base contact electrode selectively formed on the semiconductor substrate.

2. Prior Art

For achieving a high speed and performance bipolar transistor, it is essential that the base width $W_B$ be narrow and that the base resistance $Rbb'$ be small.

For realization of the high performance bipolar transistor, a technique of forming a link impurity diffusion region between an intrinsic base region which forms an active region and a graft base region formed by diffusing impurities from the base contact electrode has been proposed. This technique is disclosed for example in the Japanese Patent Application Nos. 184898/1987, 188025/1987 and 188026/1987.

However, in the technique of linking the intrinsic base region and the graft base region by the link impurity diffusion region, injuries to the structure may occur at the time of implanting ions so as to form the link impurity diffusion region. Such injuries caused by ion implantation promote accelerated diffusion in the active region or produce adverse effects by causing channeling tail. The result is that the base depth may be increased depending on the subsequent annealing.

The aforementioned Japanese Patent Application No. 184898/1987 discloses a method for producing a bipolar transistor wherein a sidewall is formed on the lateral side of the base contact electrode and a substrate portion is removed by taking advantage of this sidewall to form minute base and emitter regions. However, the adverse effect of side injection of the emitter and the base becomes predominant which interferes with the high speed operation of the transistor.

SUMMARY OF THE INVENTION

It is an object of the present invention to provide a bipolar transistor and the method for producing the same, wherein the depth of the base to collector junction is made shallow so as to realize the high performance of the device, despite the fact that the link impurity diffusion region is formed for linking the intrinsic base region and the graft base region.

According to the present invention, a device isolation region is selectively formed on a semiconductor substrate in the form of a flat plate. The base region formed on the surface of a region surrounded by the device isolation region of the semiconductor substrate is made up of a graft base region formed by diffusion from the base contact electrode, an intrinsic base region as the active region and a link impurity diffusion region for linking these regions. The emitter region is formed in the intrinsic base region. As characteristic of the present invention, a diffusion suppression region is formed in the vicinity of the junction between the base region and the portion of the semiconductor substrate serving as the collector. This diffusion suppression region has a conductivity type which is opposite to that of the base region.

The present invention also provides a method for fabricating the bipolar transistor wherein the graft base region is formed by diffusion of impurities from the base contact electrode layer and extends to the region of the semiconductor substrate which is surrounded by the device isolation region and wherein the emitter region is formed in the intrinsic base region. The method includes the steps of introducing impurities of a second conductivity type to form a link impurity diffusion region which is contiguous to the graft base region and the intrinsic base region, and introducing impurities of a first conductivity type in the vicinity of the bottom of the link impurity diffusion region to form a diffusion suppression region.

DESCRIPTION OF THE PREFERRED EMBODIMENT

Figure 1:
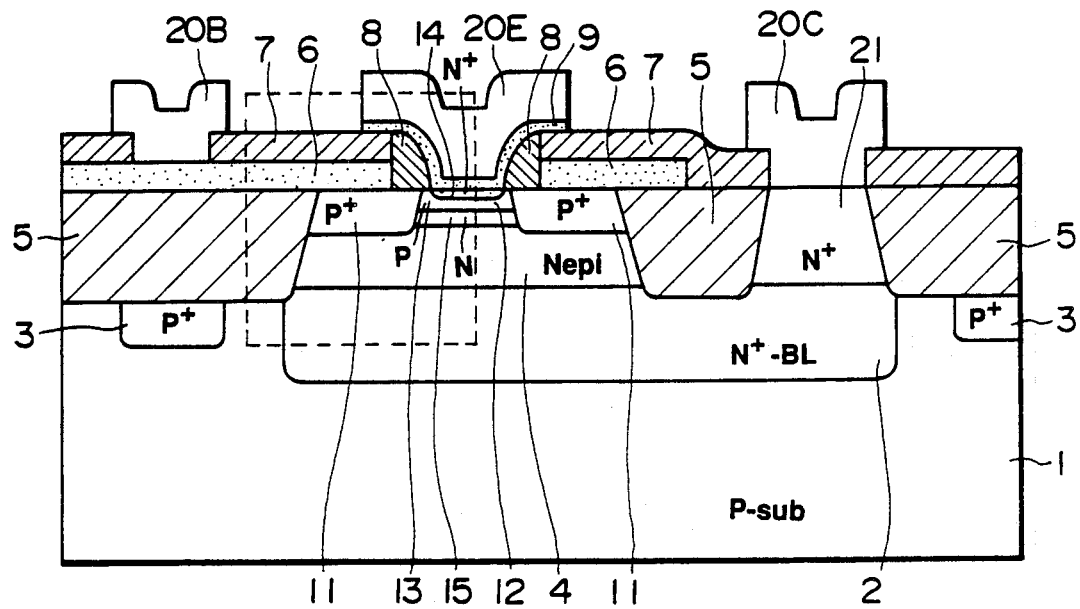
FIG. 1 is a sectional view showing an embodiment of a bipolar transistor of the present invention.

FIG. 1 shows the general construction of the bipolar transistor according to the present invention. On a P-type silicon substrate 1, there are formed an $N^+$ type buried layer 2 and a channel stopper layer 3, on the top of which is deposited an N type epitaxial layer 4. A field oxide film 5 is formed on the N type epitaxial layer 4 for device isolation. A portion of the upper part of the epitaxial layer 4 surrounded by the field oxide film 5 is confronted by a polysilicon layer 6 covered by an interlayer insulating film 7. This polysilicon layer 6 contains impurities and is used as the base contact electrode. The polysilicon layer 6 also serves as the source of diffusion of impurities for a graft base region 11 formed within the epitaxial layer 4. The polysilicon layer 6 on the epitaxial layer 4 is opened partially to form an opening. A sidewall 8 formed by etching back the oxide film formed in turn by chemical vapor deposition (CVD) exists on the lateral side of the opening. On the upper surface of the epitaxial layer 4 and the sidewall 8 is deposited a thin polysilicon layer 9, on the top of which is formed an emitter electrode 20E.

Figure 2:
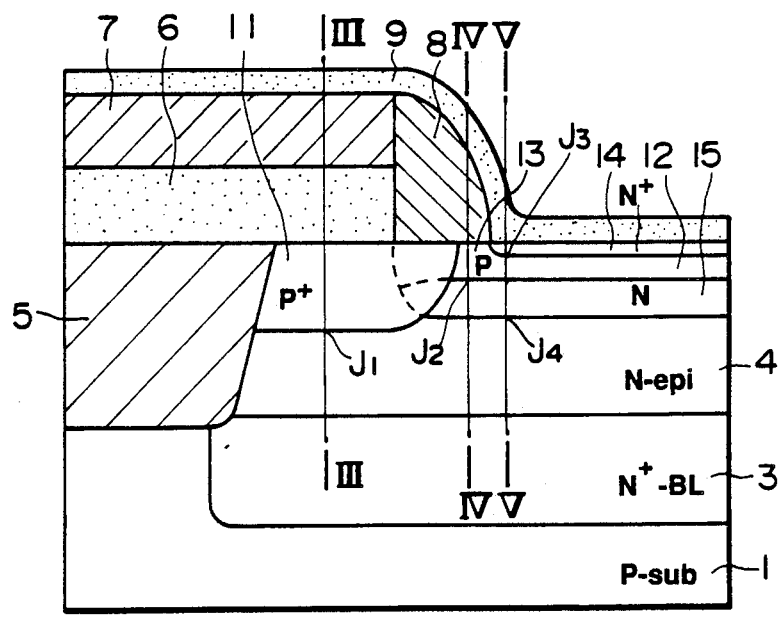
FIG. 2 is a sectional view showing essential parts thereof.

The portion of the epitaxial layer 4 in which the opening is formed is explained by referring to FIG. 2. The graft base region 11, which is the $P^+$ type impurity diffusion region, is formed by diffusion from the surface of the polysilicon layer 6 contacting the epitaxial layer 4. This graft base region 11 connects to an intrinsic base region 12, which is the P-type impurity diffusion region, via a link impurity diffusion region 13, which again is the P type impurity diffusion region. The link impurity diffusion region 13 is formed along the external planar surface of the epitaxial layer 4 from the vicinity of the end of the polysilicon layer 6 and is overlappingly connected to the graft base region 11 at a position below the sidewall 8. The intrinsic region 12 is formed by diffusion of impurities from the thin polysilicon layer 9 formed on the external planar surface and on the sidewall 8, and is overlappingly connected at the active region with the link impurity diffusion region 13. An emitter layer 14, which is the N+ type semiconductor region, is formed on the portion of the epitaxial layer 4 lying on the top of the intrinsic base region 12 and at the lower side of the polysilicon layer 9. This emitter region 14 is formed, for example, by diffusion of impurities from the polysilicon layer 9. At the lower side of the link impurity diffusion region 13 is formed a diffusion suppression region 15 for suppressing the increase in the depth of junction of the link impurity diffusion region 13. That is, due to the presence of the diffusion suppression region 15 formed in the vicinity of the junction between the link impurity diffusion region 13 and the N type epitaxial region 4 by introducing the N type impurities, the junction of the link impurity diffusion region 13, which is the diffusion region of the P type impurities, can be maintained at a shallow depth.

Figure 3:
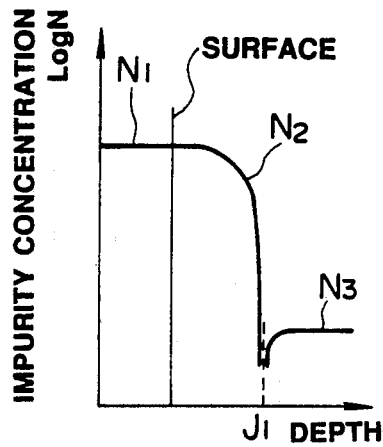
FIG. 3 is a chart showing the distribution of the concentration of impurities on a section taken along line III—III of FIG. 2.
Figure 4:
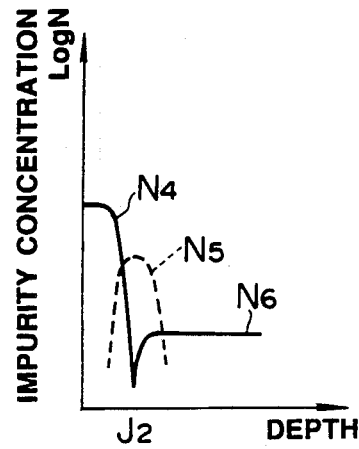
FIG. 4 is a chart showing the distribution of the concentration of impurities on a section along line IV—IV of FIG. 2.
Figure 5:
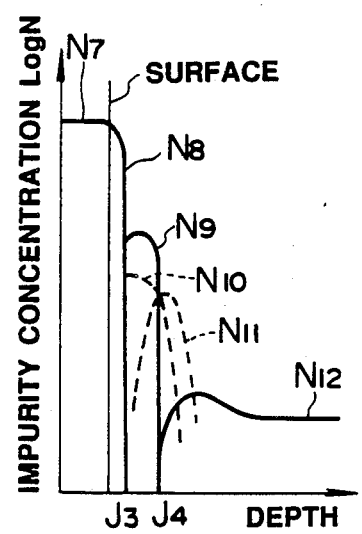
FIG. 5 is a chart showing the distribution of the concentration of impurities on a section taken along line V—V of FIG. 2.

FIGS. 3, 4 and 5 show the distribution of the concentration of the impurities on the sections taken along lines III—III, IV—IV and V—V in FIG. 2. The ordinate represents the concentration of the impurities expressed by a logarithmic scale and the abscissa represents the depth.

FIG. 3 shows a section along line III—III. The distribution of the concentration of impurities above the surface of the epitaxial layer 4 is the concentration of the impurities $N_1$ of the polysilicon layer 6. Since the graft base region 11 is formed by diffusion of impurities from the polysilicon layer 6, the impurity region $N_2$ is equal to that of layer 6 in the vicinity of the surface, and the concentration of the impurities $N_2$ is lowered gradually as the junction $J_1$ is approached. From the junction $J_1$ on, the concentration is the concentration of impurities $N_3$ of the N type epitaxial layer 4.

FIG. 4 shows a section along line IV—IV. The impurity diffusion region 13 extends from the surface of the epitaxial layer 4, with the concentration of the impurities $N_4$ decreasing gradually towards the junction $J_2$. The subjacent region of the surface is the epitaxial layer 4 where the distribution of the concentration of the N type impurities $N_6$ prevails. The impurities are introduced in the vicinity of the junction $J_2$ to a concentration of impurities $N_5$ for forming the diffusion suppression region 15. Thus the depth of the junction $J_2$ need not be increased by, for example, thermal processing.

FIG. 5 shows a section along line V—V. The distribution of the impurities above the surface of the epitaxial layer 4 is the concentration of impurities $N_7$ of the polysilicon layer 7 of reduced thickness. The emitter region 14 directly below the surface has a comparable concentration of impurities $N_8$ which is gradually lowered towards the junction $J_3$. The distribution of impurities $N_9$ of the intrinsic base region 12 existss from the junction $J_3$ to the junction $J_4$. From the lower side of the junction $J_4$ of the intrinsic base region 12, the distribution of the concentration of the impurities $N_{12}$ of the epitaxial layer 4 exists. On the section along line V—V, as shown by the broken lines therein, there exist the distribution of the concentration of impurities $N_{10}$ of the link impurity diffusion region 13 (corresponding to the concentration of impurities $N_4$ shown in FIG. 4) and the distribution of the concentration of the impurities $N_{11}$ for procuring the diffusion suppression region 15 (corresponding to the concentration of impurities $N_5$ in FIG. 4). In this manner, positive connection to the intrinsic base region 12 can be realized through the link impurity diffusion region 13. Due to the concentration of impurities $N_{11}$, it is possible to improve the bipolar transistor without the disadvantage caused by increasing the depth of the junction $J_4$.

In the above described bipolar transistor, the base width $W_B$ can be prevented from being increased and the operation speed of the device can be increased due to the fact that the depth of junction can be prevented from being increased due to the diffusion suppression region 15. Inasmuch as the depth of junction can be made shallow, it is not necessary to remove the surface of the epitaxial layer 4 to provide the emitter and base regions. Thus it becomes possible to suppress the effects of side injection.

In addition, the Kirk effect can be suppressed because the concentration $N_5$ of impurities introduced for forming the diffusion suppression region 15 is set so as to be higher than the concentration of impurities of the N type epitaxial layer 4. A low power consumption type bipolar transistor and a high speed bipolar transistor can be selectively prepared by controlling the concentrations of the impurities $N_5$ and $N_{11}$.

It is noted that the buried layer 2 in FIG. 1 is contiguous to the collector electrode 20C via the collector region 21. The polysilicon layer 6 is contiguous to the base electrode 20B and is covered with a portion of the insulating film 7. The present invention is applicable PNP transistors as well as to NPN transistors of the above described embodiment.

The method of producing the bipolar transistor will be explained with reference to the process steps shown in FIG. 6a to 6d.

Figure 6A:
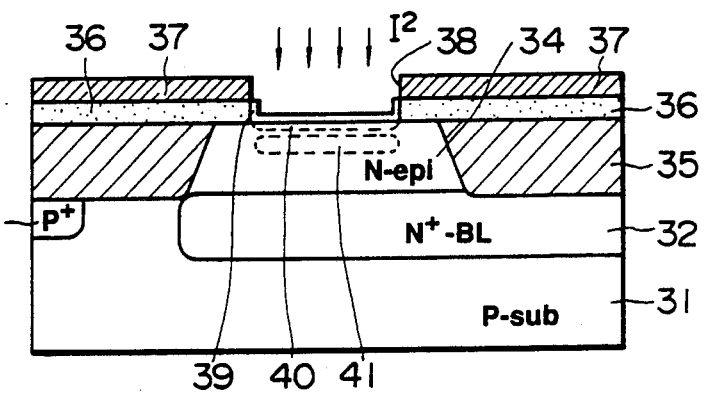
FIGS. 6a to 6d are sectional views for illustrating the various steps of the method for producing the bipolar transistor according to the present invention.

Referring to FIG. 6a, an epitaxial layer 34 is deposited on a P type silicon substrate 31 on which the N+ type buried layer 32 and the channel stopper region 33 have previously been formed, and a field oxide film 35, acting as the region for device isolation, is formed on the epitaxial layer 34 by a selective oxidation process. On the top of the epitaxial layer 34, which is surrounded by the field oxide film 35, there is formed a polysilicon layer 36 which is selectively formed so as to face the external planar surface of the epitaxial layer 34 and is opened so as to partially form an opening 38 and it is covered by the interlayer insulating film 37. A thin oxide film 39 which acts as a buffer film is formed in the opening 38.

After the oxide film 39 is formed in this manner, ion implantation is performed for forming the impurity diffusion region. Dopants such as B+ or BF$_2^+$ can be used, for this ions are implanted. Ion implate into a region 40 in the vicinity of the external planar surface of the epitaxial layer 34 so as to avoid the increase in the depth of the base region. It is noted that impurities are not introduced into the region below the polysilicon layer 36 so that the layer 36 may act as a mask.

From the same opening 38, ion implantation is carried out for forming the diffusion suppression region through the oxide film 39. This ion implantation is performed using impurities as P+ in such a fashion such that the impurities are doped into a deeper region 41 than in the case of the ion implantation used for at forming the link impurity diffusion region. The Kirk effect can be suppressed by positively increasing the concentration of impurities used in the ion implantation. The low power consumption type bipolar transistor and the high speed type bipolar transistor can be selectively obtained by controlling the concentration of the impurities used in ion implantation.

A thick oxide film 43 is then formed on the overall surface by, for example, a chemical vapor deposition method. The opening 38 provided with a thin oxide film 39 on its bottom is also covered by the thick oxide film 43.

Figure 6B:
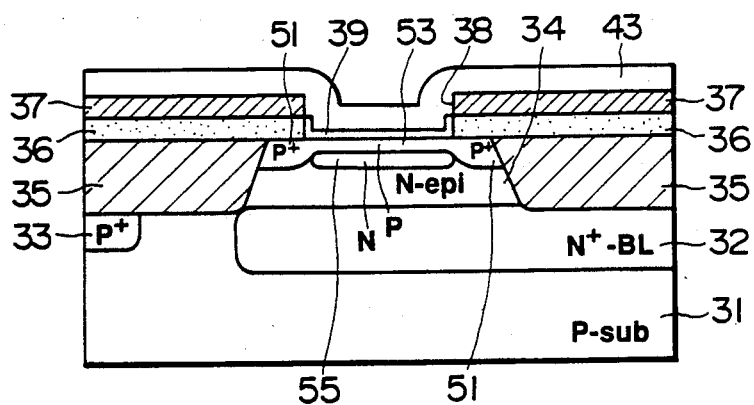

Then, a thermal treatment is performed, as shown in FIG. 6b, for diffusing impurities from the polysilicon layer 36 acting as the base contact electrode to form a graft base region 51. The impurities doped into the region 40 are thermally treated to form the link impurity diffusion region 53 in the vicinity of the external planar surface of the epitaxial layer 34 on the bottom of the opening 38. The impurities in the region 41 are also activated to form the diffusion suppression region 55 in the vicinity of the junction with the link impurity diffusion region 53.

The thick oxide film 43, which acted as the anneal cap, is now etched back and caused to remain on the side of the opening 38 as the sidewall position 44. At this time, the oxide film 39 within the opening 38 is also removed.

A thin polysilicon layer 45 is formed on the overall surface. This polysilicon layer 45 is extended from the upper surface of the interlayer insulating film 37 to over the sidewall portion 44 and from the sidewall portion 44 to over the exterior planar surface on which the link impurity diffusion layer 53 is formed.

Figure 6C:
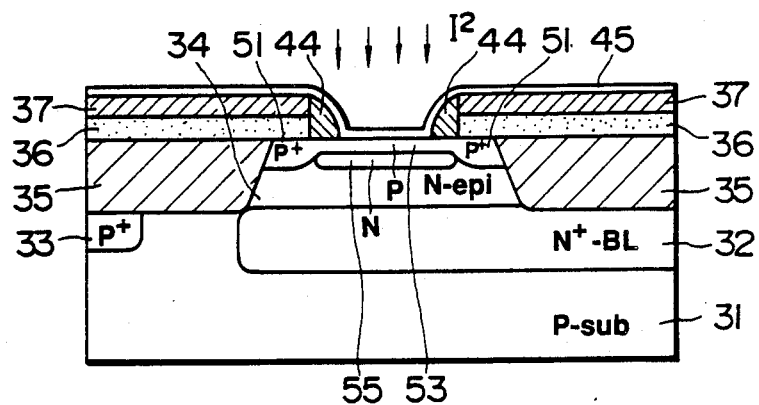

Then, as shown in FIG. 6c, ions are implanted over the overall surface. By this ion implantation, impurities are introduced into the thin polysilicon layer 45. The introduced impurities are $B^+$ or $BF_2^+$, for example, and the intrinsic base region 52 is formed by these impurities in the planar surface of the epitaxial layer 34 so as to be contiguous to the link impurity diffusion region 53. It is noted that the sidewall portion 44 may act as the mask for the ion implantation and the diffusion of impurities.

Then an annealing is performed for forming the intrinsic base region 52. It is noted that the intrinsic base region 52 is formed by diffusion of impurities from the polysilicon layer 45 and there is no adverse effect caused by ion implantation, such as channeling tail. The region in which the intrinsic base region 52 is formed overlaps the link impurity diffusion region 53, and the diffusion suppression region 55 is formed on the lower portion of the link impurity diffusion layer 53, so that the base $W_B$ of the intrinsic base region 52 may be reduced.

Figure 6D:
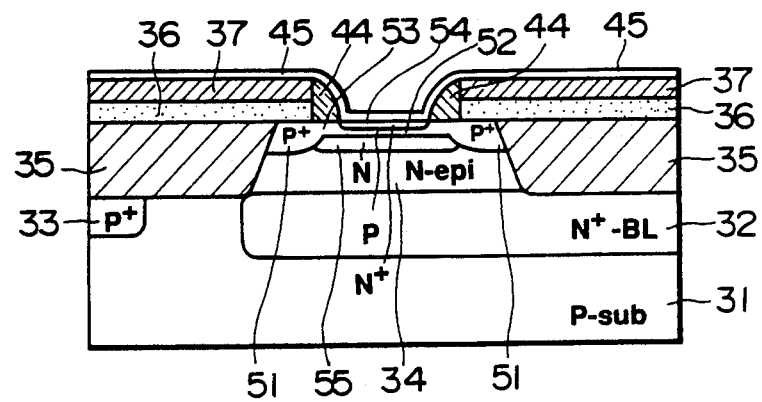

Ion implantation is again performed into the polysilicon layer 45. The impurities used in this ion implantation may be $As^+$, for example, and the emitter region 54 is formed by diffusion of these impurities from the polysilicon layer 45 by thermal treatment. The bipolar transistor shown in FIG. 6d is thus obtained.

The bipolar transistor having the above described diffusion suppression region 55 may be obtained by the above described process steps. In this bipolar transistor, a low base resistance Rbb' is realized by the link impurity diffusion region 53, while the adverse effects such as deterioration in the voltage withstanding properties of the emitter to base resistance Rbb' or the $V_{BE}$ matching properties or the lowering in $f_T$ are not obtained. Also, by virtue of the diffusion suppression region 55, the base width $W_B$ can be prevented from being increased. In addition, by controlling the concentration of the impurities, it is possible to suppress the Kirk effect and, to produce low power consumption types or high speed types devices.

It is noted that the above process for the preparation of NPN type bipolar transistors may also be used to form PNP bipolar transistors.

I claim:

1. A bipolar transistor in which a base region of a second conductivity type is formed in a semiconductor substrate of a first conductivity type and an emitter region of a first conductivity type is formed in the semiconductor region to provide a vertical type PNP or NPN, comprising a semiconductor substrate of a first conductivity type having an exterior planar surface and with which a collector electrode is connected,
   a device insulation region selectively formed for facing to the surface of said semiconductor substrate, and
   a base region consisting of a graft base region formed on the exterior planar surface of said semiconductor substrate surrounded by said device insulation region, said graft base region being formed by diffusion of impurities from a base contact electrode extending on said surface, an intrinsic base region formed at a distance from said graft base region and including an emitter region, and a link impurity diffusion region linking said intrinsic base region and said graft base region,
   whereby a diffusion suppression region formed by introduction of the impurities of the first conductivity type is provided in the vicinity of the junction between said base region and the semiconductor substrate of the first conductivity type.

2. The bipolar transistor according to claim 1 wherein the semiconductor substrate of the first conductivity type is formed by providing a buried layer of the first conductivity type on the silicon substrate of the second conductivity type and an epitaxial layer of a first conductivity type is formed on the buried layer.

3. The bipolar transistor according to claim 2 wherein the depth of junction between the intrinsic base region and the epitaxial layer has a peak of the concentration of impurities of the diffusion suppression region.

4. The bipolar transistor according to any one of claims 1 to 3 wherein the intrinsic base region and emitter region are formed by diffusing impurities from a polysilicon layer through a opening of an interlayer insulating film covering a base contact electrode, the polysilicon layer being formed on a sidewall formed on the lateral side of a opening of base contact electrode and an insulating film.

* * * * *